(12) United States Patent
Gleason et al.

(10) Patent No.: US 7,394,269 B2
(45) Date of Patent: *Jul. 1, 2008

(54) PROBE FOR TESTING A DEVICE UNDER TEST

(75) Inventors: K. Reed Gleason, Portland, OR (US); Tim Lesher, Portland, OR (US); Mike Andrews, Cornelius, OR (US); John Martin, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/888,957

(22) Filed: Aug. 3, 2007

(65) Prior Publication Data

US 2007/0273399 A1    Nov. 29, 2007

Related U.S. Application Data

(63) Continuation of application No. 11/391,895, filed on Mar. 28, 2006, now Pat. No. 7,271,603, which is a continuation of application No. 10/445,174, filed on May 23, 2003, now Pat. No. 7,057,404.

(51) Int. Cl.
*G01R 31/02* (2006.01)
(52) U.S. Cl. ..................... 324/754; 327/762
(58) Field of Classification Search ......... 324/754–762, 324/72.5; 439/482; 333/246–248
See application file for complete search history.

(56) References Cited

U.S. PATENT DOCUMENTS 5,565,788 A * 10/1996 Burr et al. .................. 324/762
7,271,603 B2 * 9/2007 Gleason et al. ............. 324/754

* cited by examiner

*Primary Examiner*—Vinh P Nguyen
(74) *Attorney, Agent, or Firm*—Chernoff, Vilhauer, McClung & Stenzel

(57) ABSTRACT

A probe measurement system for measuring the electrical characteristics of integrated circuits or other microelectronic devices at high frequencies.

12 Claims, 4 Drawing Sheets

PROBE FOR TESTING A DEVICE UNDER TEST

CROSS-REFERENCE TO RELATED APPLICATIONS

This application is a continuation of U.S. patent application Ser. No. 11/391,895, filed Mar. 28, 2006, now U.S. Pat. No. 7,271,603 which application is a continuation of U.S. patent application Ser. No. 10/445,174, filed May 23, 2003, now U.S. Pat. No. 7,057,404.

BACKGROUND OF THE INVENTION

The present invention relates to probe measurement systems for measuring the electrical characteristics of integrated circuits or other microelectronic devices at high frequencies.

There are many types of probing assemblies that have been developed for the measurement of integrated circuits and other forms of microelectronic devices. One representative type of assembly uses a circuit card on which the upper side are formed elongate conductive traces that serve as signal and ground lines. A central opening is formed in the card, and a needle-like probe tip is attached to the end of each signal trace adjacent the opening so that a radially extending array of downwardly converging needle-like tips is presented by the assembly for selective connection with the closely spaced pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

In order to obtain device measurements at somewhat higher frequencies than are possible with the basic probe card system described above, various related probing systems have been developed. Such systems are shown, for example, in Evans U.S. Pat. No. 3,849,728; Kikuchi Japanese Publication No. 1-209,380; Sang et al. U.S. Pat. No. 4,749,942; Lao et al. U.S. Pat. No. 4,593,243; and Shahriary U.S. Pat. No. 4,727,319. Yet another related system is shown in Kawanabe Japanese Publication No. 60-223,138 which describes a probe assembly having needle-like tips where the tips extend from a coaxial cable-like structure instead of a probe card. A common feature of each of these systems is that the length of the isolated portion of each needle-like probe tip is limited to the region immediately surrounding the device-under-test in order to minimize the region of discontinuity and the amount of inductive loss. However, this approach has resulted in only limited improvement in higher frequency performance due to various practical limitations in the construction of these types of probes. In Lao et al., for example, the length of each needle-like tip is minimized by using a wide conductive blade to span the distance between each tip and the supporting probe card, and these blades, in turn, are designed to be arranged relative to each other so as to form transmission line structures of stripline type. As a practical matter, however, it is difficult to join the thin vertical edge of each blade to the corresponding trace on the card while maintaining precisely the appropriate amount of face-to-face spacing between the blades and precisely the correct pitch between the ends of the needle-like probe tips.

One type of probing assembly that is capable of providing a controlled-impedance low-loss path between its input terminal and the probe tips is shown in Lockwood et al. U.S. Pat. No. 4,697,143. In Lockwood et al., a ground-signal-ground arrangement of strip-like conductive traces is formed on the underside of an alumina substrate so as to form a coplanar transmission line on the substrate. At one end, each associated pair of ground traces and the corresponding interposed signal trace are connected to the outer conductor and the center conductor, respectively, of a coaxial cable connector. At the other end of these traces, areas of wear-resistant conductive material are provided in order to reliably establish electrical connection with the respective pads of the device to be tested. Layers of ferrite-containing microwave absorbing material are mounted about the substrate to absorb spurious microwave energy over a major portion of the length of each ground-signal-ground trace pattern. In accordance with this type of construction, a controlled high-frequency impedance (e.g., 50 ohms) can be presented at the probe tips to the device under test, and broadband signals that are within the range, for example, of DC to 18 gigahertz can travel with little loss from one end of the probe assembly to another along the coplanar transmission line formed by each ground-signal-ground trace pattern. The probing assembly shown in Lockwood et al. fails to provide satisfactory electrical performance at higher microwave frequencies and there is a need in microwave probing technology for compliance to adjust for uneven probing pads.

To achieve improved spatial conformance between the tip conductors of a probe and an array of non-planar device pads or surfaces, several high-frequency probing assemblies have been developed. Such assemblies are described, for example, in Drake et al. U.S. Pat. No. 4,894,612; Coberly et al. U.S. Pat. No. 4,116,523; and Boll et al. U.S. Pat. No. 4,871,964. The Drake et al. probing assembly includes a substrate on the underside of which are formed a plurality of conductive traces which collectively form a coplanar transmission line. However, in one embodiment shown in Drake et al., the tip end of the substrate is notched so that each trace extends to the end of a separate tooth and the substrate is made of moderately flexible nonceramic material. The moderately flexible substrate permits, at least to a limited extent, independent flexure of each tooth relative to the other teeth so as to enable spatial conformance of the trace ends to slightly non-planar contact surfaces on a device-under-test. However, the Drake et al. probing assembly has insufficient performance at high frequencies.

With respect to the probing assembly shown in Boll et al., as cited above, the ground conductors comprise a pair of leaf-spring members the rear portions of which are received into diametrically opposite slots formed on the end of a miniature coaxial cable for electrical connection with the cylindrical outer conductor of that cable. The center conductor of the cable is extended beyond the end of the cable (i.e., as defined by the ends of the outer conductor and the inner dielectric) and is gradually tapered to form a pin-like member having a rounded point. In accordance with this construction, the pin-like extension of the center conductor is disposed in spaced apart generally centered position between the respective forward portions of the leaf-spring members and thereby forms, in combination with these leaf-spring members, a rough approximation to a ground-signal-ground coplanar transmission line structure. The advantage of this particular construction is that the pin-like extension of the cable's center conductor and the respective forward portions of the leaf-spring members are each movable independently of each other so that the ends of these respective members are able to establish spatially conforming contact with any non-planar contact areas on a device being tested. On the other hand, the transverse-spacing between the pin-like member and the respective leaf-spring members will vary depending on how forcefully the ends of these members are urged against the contact pads of the device-under-test. In other words, the transmission characteristic of this probing structure, which is dependent on the spacing between the respective tip members, will vary in an ill-defined manner during each probing cycle, especially at high microwave frequencies.

Burr et al., U.S. Pat. No. 5,565,788, disclose a microwave probe that includes a supporting section of a coaxial cable including an inner conductor coaxially surrounded by an outer conductor. A tip section of the microwave probe includes a central signal conductor and one or more ground conductors generally arranged normally in parallel relationship to each other along a common plane with the central signal conductor so as to form a controlled impedance structure. The signal conductor is electrically connected to the inner conductor and the ground conductors are electrically connected to the outer conductor, as shown in FIG. 1. A shield member is interconnected to the ground conductors and covers at least a portion of the signal conductor on the bottom side of the tip section. The shield member is tapered toward the tips with an opening for the tips of the conductive fingers. The signal conductor and the ground conductors each have an end portion extending beyond the shield member and the end portions are able to resiliently flex, despite the presence of the shielding member, relative to each other and away from their common plane so as to permit probing devices having non-planar surfaces.

In another embodiment, Burr et al. disclose a microwave probe that includes a supporting section of a coaxial cable including an inner conductor coaxially surrounded by an outer conductor, as shown in FIGS. 2A, 2B, and 2C. A tip section of the microwave probe includes a signal line extending along the top side of a dielectric substrate connecting a probe finger with the inner conductor. A metallic shield may be affixed to the underside of the dielectric substrate and is electrically coupled to the outer metallic conductor. Ground-connected fingers are placed adjacent the signal line conductors and are connected to the metallic shield by way of vias through the dielectric substrate. The signal conductor is electrically connected to the inner conductor and the ground plane is electrically connected to the outer conductor. The signal conductor and the ground conductor fingers (connected to the shield via vias) each have an end portion extending beyond the shield member and the end portions are able to resiliently flex, despite the presence of the shielding member, relative to each other and away from their common plane so as to permit probing devices having non-planar surfaces. While the structures disclosed by Burr et al. are intended to provide uniform results of a wide frequency range, they unfortunately tend to have non-uniform response characteristics at high microwave frequencies.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

The present inventors considered the co-planar fingered probing devices disclosed by Burr et al., including the co-planar finger configuration and the microstrip configuration with fingers extending therefrom. In both cases, electromagnetic fields are created during probing between the fingers. These electromagnetic fields encircle each of the fingers, electrically couple the signal finger to the ground fingers, and electrically couple the ground fingers one another. While the probing device is being used for probing, the resulting electromagnetic fields surrounding the fingers interact with the wafer environment. While probing in different regions of the wafer, the interaction between the electromagnetic fields around the fingers and the wafer change, typically in an unknown manner. With a significant unknown change in the interaction it is difficult, if not impossible, to accurately calibrate out the environmental conditions while probing a device under test.

When multiple probes are being simultaneously used for probing the same area of the wafer, the probe tips come into close proximity with one another and result in additional coupling between the probes, normally referred to as crosstalk. In addition, the region between the support for the fingers, such as a dielectric substrate, and the extended portion of the fingers results in a significant capacitance, which impedes high frequency measurements.

The present inventors were surprised to determine that the microstrip structure disclosed by Burr et al. further does not calibrate well on calibration test substrates at very high frequencies, such as in excess of 70 GHz. This calibration is independent of potential interaction with a wafer at a later time during actual probing of a device under test. After examination of this unexpected non-calibration effect the present inventors speculate that an energy is created in an "undesired mode", other than the dominant field modes, at such extreme frequencies. This "undesired mode" results in unexpected current leakages from the signal path thus degrading the signal integrity. The present inventors further speculate that this "undesired mode" involves resonating energy in the ground plane as a result of discontinuities in the ground path, including for example, the connection between the ground plane and the external portion of the cable, and the inductance in the ground plane. This ground plane resonant energy results in unpredictable changing of the energy in the signal path to the device under test, thus degrading performance. This degradation wasn't apparent at lower operating frequencies, so accordingly, there was no motivation to modify existing probe designs in order to eliminate or otherwise reduce its effects.

Figure 1:
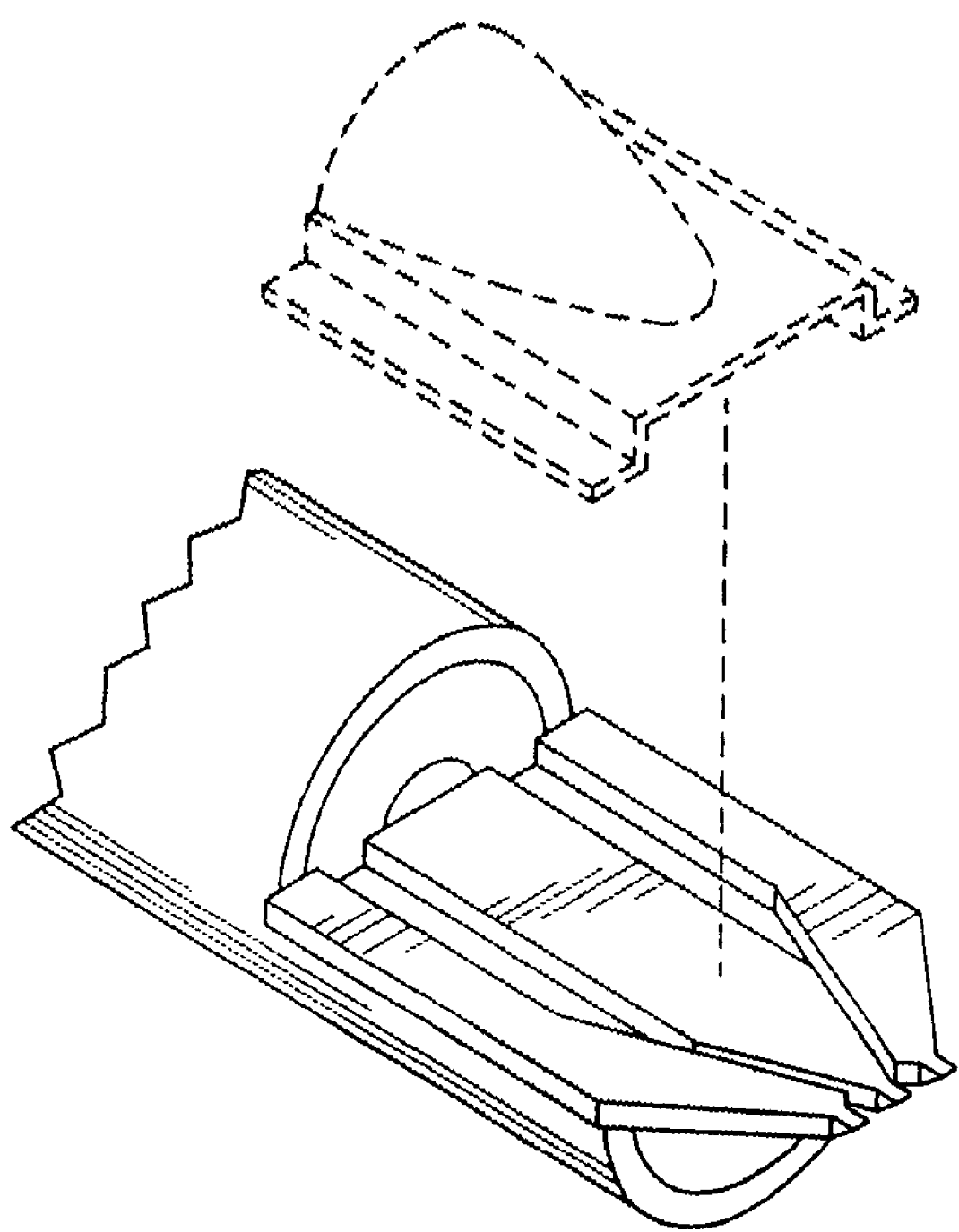
FIG. 1 illustrates an existing probe.
Figure 2A:
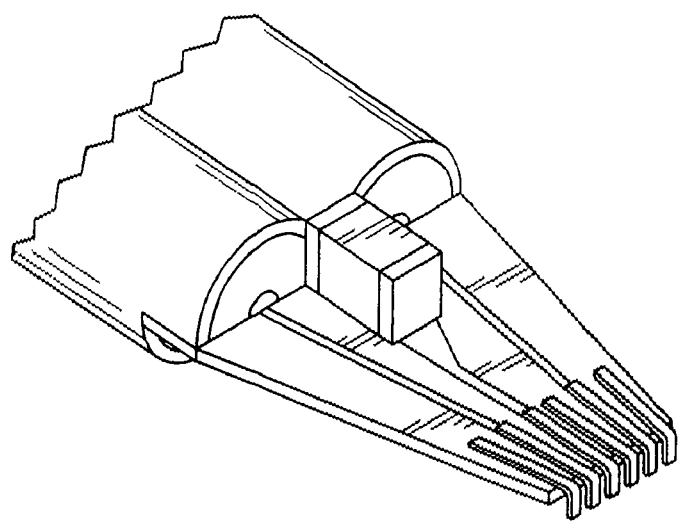
FIGS. 2A-2C illustrate another existing probe.
Figure 2B:
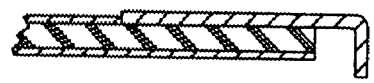
Figure 2C:
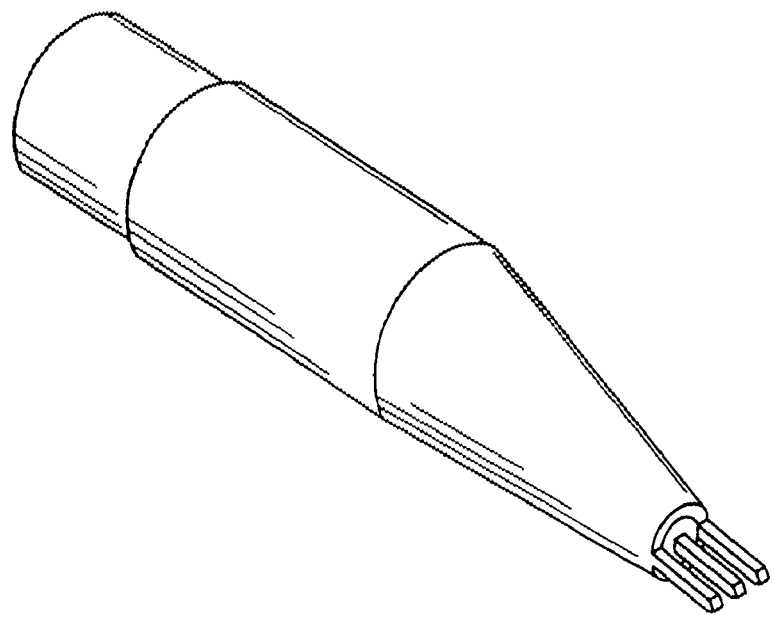
Figure 3:
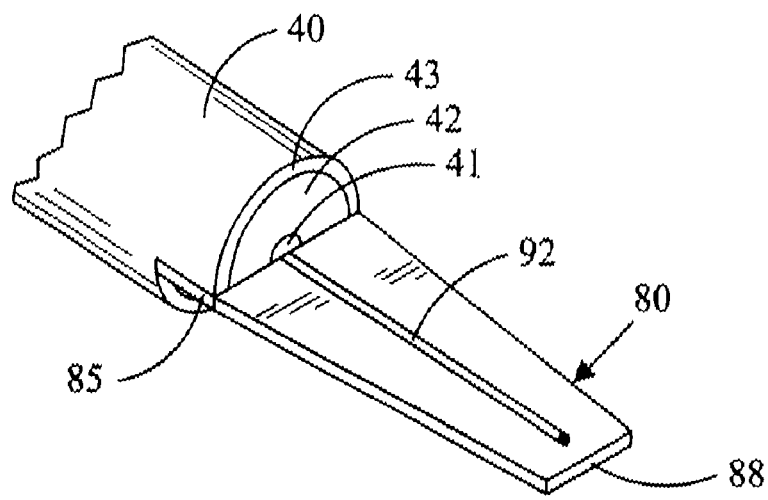
FIG. 3 illustrates one embodiment of a probe.

Referring to FIG. 3, a semi-rigid coaxial cable 40 is electrically connected at its rearward end to a connector (not shown). The coaxial cable 40 normally includes an inner conductor 41, a dielectric material 42, and an outer conductor 43. The coaxial cable 40 may likewise include other layers of materials, as desired. The forward end of the cable 40 preferably remains freely suspended and, in this condition, serves as a movable support for the probing end of the probe.

Figure 4:
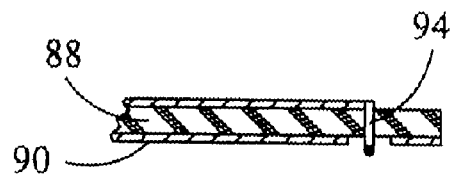
FIG. 4 illustrates a side view of a portion of the probe of FIG. 3.

A microstrip style probe tip 80 includes a dielectric substrate 88 that is affixed to the end of the coaxial cable 40. The underside of the cable 40 is cut away to form a shelf 85, and the dielectric substrate 88 is affixed to the shelf 85. Alternatively, the dielectric substrate 88 may be supported by an upwardly facing shelf cut away from the cable or the end of the cable without a shelf. Referring also to FIG. 4, a conductive shield 90, which is preferably planar in nature, is affixed to the bottom of the substrate 88. The conductive shield 90, may be for example, a thin conductive material (or otherwise) that is affixed to the substrate 88. By using a generally planar conductive material having a low profile the shield 90 is less likely to interfere with the ability to effectively probe a device under test by accidently contacting the device under test. The conductive shield 90 is electrically coupled to the outer conductor 43 to form a ground plane. The other conductor 43 is typically connected to the ground, though the outer conductor 43 may be provided with any suitable voltage potential (either DC or AC). The conductive shield 90 preferably covers all of the lower surface of the substrate 88. Alternatively, the conductive shield 90 may cover greater than 50%, 60%, 70%, 80%, 90%, and/or the region directly under a majority (or more) of the length of a conductive signal trace on the opposing side of the substrate 88.

One or more conductive signal traces 92 are supported by the upper surface of the substrate 88. The conductive traces 92, may be for example, deposited using any technique or otherwise supported by the upper surface of the substrate. The conductive trace(s) 92 is electrically interconnected to the inner conductor 41 of the coaxial cable 40. The inner conductor 41 of the coaxial cable 40 and the conductive trace(s) 92 normally carries the signal to and from the device under test. The conductive trace(s) 92 together with the shield layer 90 separated by a dielectric material 88 form one type of a microstrip transmission structure. Other layers above, below, and/or between the shield layer 90 and the conductive trace 92 may be included, if desired.

To reduce the effects of the aforementioned unexpected high frequency signal degradation, the present inventors determined that the signal path may include a conductive via 94 passing through the substrate 88. The conductive via 94 provides a manner of transferring the signal path from the upper surface of the substrate to the lower surface of the substrate. The conductive via 94 avoids the need for using a conductive finger extending out from the end of the substrate 88 that would otherwise result in a significant capacitance between the extended finger and the end of the substrate 88. The conductive via 94 provides a path from one side of the substrate 88 to the other side of the substrate 88 in a manner free from an air gap between the conductive via 94 and the substrate 88 for at least a majority of the thickness of the substrate 88. In addition, the shield layer 90 preferably extends beyond the via 94 to provide additional shielding.

Figure 5:
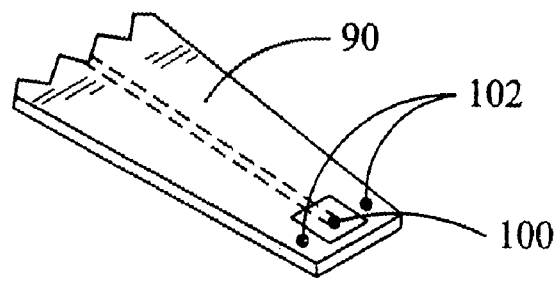
FIG. 5 illustrates a bottom view of a portion of the probe of FIG. 3.

Referring also to FIG. 5, the lower surface of the substrate 88 illustrates a contact bump 100 electrically connected to the via 94 and the trace 92 extending below the lower surface of the substrate 88 and the shield 90 which may be used to make contact with the device under test during probing. The conductive shield 90 may include an "patterned" section around the contact "bump" 100 so that the shield layer 90 and the signal path are free from being electrically interconnected (e.g., the shield layer 90 may be greater than 50%, 75%, or laterally surrounding all of the contact at some point). It is to be understood that the contact may take any suitable form, such as for example a bump, a patterned structure, a conductive structure, a needle structure, or an elongate conductor. The conductive shield 90 may laterally encircle the conductive bump which increases the resistance to external electromagnetic fields. Also, the conductive shield 90 extending beyond the conductive bump 100 reduces the crosstalk from other probes. For some probing applications, one or more shield 90 contacts 102 may be provided, if desired. The shield layer and the conductive trace are normally constructed to provide a microstrip transmission line controlled impedance structure. While typically the signal line has a test signal and the shield has a ground potential, the two conductive paths may likewise be any other configuration, such as balanced inputs which vary with respect to ground.

Figure 6:
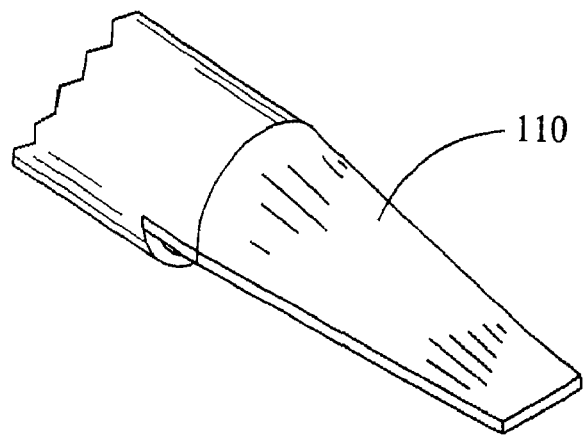
FIG. 6 illustrates another embodiment of a probe.

Referring to FIG. 6, the probe may employ an outer cone shaped upper shield 110. The outer conductor 43 of the coaxial cable is connected to the upper shield 110 is therefore electrically connected to ground. This design provides a smooth transition between the coaxial cable and the end of the probe. The probe is therefore shielded as it transitions to the tip of the cone portion.

The upper shield 110 has a tapered cylindrical portion whose forward end is a tapered tip and whose rear end has a contour that is in continuous contact with the outer coaxial conductor along its circumference so that there is no gap between the outer conductor and portions of the shield that could create fringing fields that could effect probe measurements. Likewise, any other shape may be used for the shield 110, as desired. In addition, the forward end preferably extends past the via and forms a substantially closed region so that there is reduced fringing fields at the forward end. The shield reduces parasitic coupling to any external structure and the construction of the shield as a single piece of metal reduces complexity of assembly. The shield is preferably made of a thin foil and is capable of being formed by a fabrication process. The shield may also be deposited or made of other material.

The lower shield member 90 extends underneath the conductive trace between the fingers and the chuck holding the device under test. The shield therefore helps to block the generation of ground plane resonant modes that can otherwise interfere with and degrade the signal from the device under test.

Figure 7:
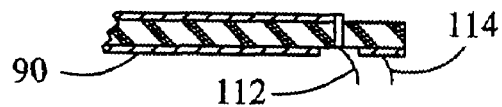
FIG. 7 illustrates yet another embodiment of a probe.

Referring to FIG. 7, in an alternative embodiment a conductive finger 112 or other elongate conductive element may be provided that is electrically interconnected to the via. One or more additional ground fingers 114 may be electrically connected to the lower shield material. If desired, each respective finger may include a cantilevered portion that extends down away from the substrate. The cantilevered portions are preferably arranged in transversely spaced apart relationship to each other so as to cooperatively form a controlled impedance transmission line in order that a low loss transition can be made between the respective conductors on the cable and the respective pads on the device-under test.

While the use of an upper shield 110 that includes a curved surface provides an improvement to signal integrity, the changes in the structure of the upper shield tend to introduce some limitations into the signal integrity at high frequencies, thus impeding performance. For example, the changes in the height of the upper shield changes the electromagnetic field pattern along the length of the signal conductor. In addition, increased manufacturing complexity occurs with the upper shield. Furthermore, in most cases microwave microstrip transmission structures are enclosed in a housing, such as a conductive case, and accordingly there is reduced motivation to include an upper shield structure.

To further increase the performance at high frequencies the present inventors considered the effects of the substrate material. In many cases the dielectric constant of the dielectric substrate material is high, such as $Al_2O_3$ which has a 9.9 dielectric constant. Materials with a high dielectric constant have a tendency to concentrate the electromagnetic fields therein, thus decreasing the electromagnetic fields susceptible to influence by other devices. In addition, the thickness of the substrate is typically 250-500 microns to provide mechanical stability. Thus the fields tend to concentrate within the substrate.

Figure 8:
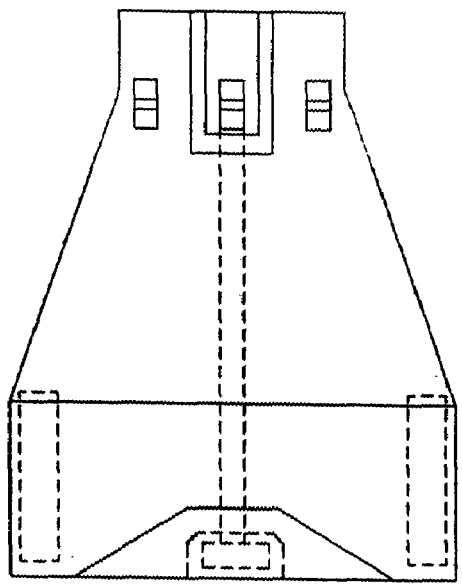
FIG. 8 illustrates still another embodiment of a probe.
Figure 8:
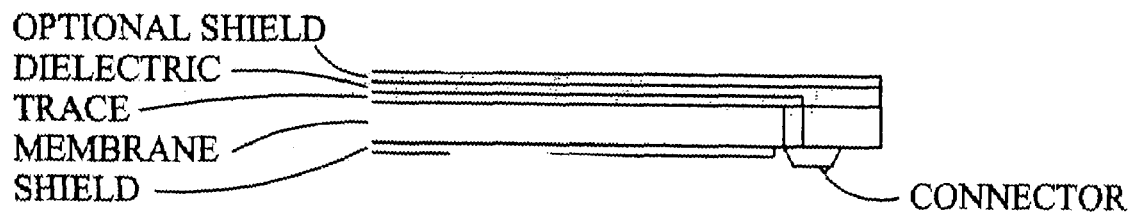

Referring to FIG. 8, while considering such substrates the present inventors came to the realization that the flexible membrane substrate may be substituted for the more rigid substrate 88. An example of membrane material is described in U.S. Pat. No. 5,914,613, incorporated by reference herein together will all other references cited herein incorporated by reference herein. In general, membrane based probes are characterized by a flexible (or semi-flexible) substrate with traces supported thereon together with contacting portions being supported thereon. The membrane portion of the probe may be constructed from a sacrificial substrate into which is created a depression. Into this depression is located conductive material, traces are located thereon if desired, and flexible dielectric material is located on or under the traces. Thereafter, the sacrificial substrate is removed leaving the probe tip, traces, and membrane material. The contacting portions come into contact with the device under test and the traces are normally on the opposing side of the membrane connected to the contacting portions using vias. In many cases, the membrane technology may be significantly thinner than ceramic based substrates, (see, e.g., substrate 88) such as 40, 30, 20, 10, 5, or 3 microns or less. Normally the dielectric constant of the membrane material is 7 or less, sometimes less than 6, 5, or 4 depending on the particular material used. While normally using a lower dielectric constant substrate is unsuitable, using a significantly thinner substrate together with a lower dielectric constant substrate raises the theoretical frequency range of effective signal transmission to 100's of GHz. The significantly thinner substrate material permits positioning the lower shield material significantly closer to the signal traces than the relatively thick ceramic substrate, and therefore tends to more tightly confine the electromagnetic fields there between. With a tight confinement of the electric fields in the membrane material, the present inventors determined that the high frequency performance of the membrane material may be increased by locating an upper shield material above the membrane material. Moreover, the upper shield material should likewise be correspondingly close to the signal path, so the curved upper shield material positioned at a significant distance from the signal trace previously used may not normally be sufficient. Accordingly, the shield material should be patterned on the top of the membrane material with a dielectric between the signal trace and the upper shield material. In many cases, the distance between the signal trace and the upper shield directly above the signal trace should be no more than 10 times the distance between the signal trace and the lower shield material. More preferably, the aforementioned distance would be preferably 7, 5, 4, or 2 times.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe comprising:
   (a) a dielectric substrate;
   (b) an elongate conductor suitable to be electrically interconnected to a test signal supported by a first side of said substrate;
   (c) a conductive member suitable to be electrically interconnected to a ground signal supported by said second side of said substrate wherein said conductive member and said elongate conductor form a controlled impedance structure;
   (d) a conductive path between said first side of said substrate and said second side of said substrate in a manner free from an air gap between the conductive path and an edge of said substrate for at least a majority of the thickness of said substrate and said conductive path free from electrical interconnection with said conductive member; and
   (e) a contact electrically interconnected to said conductive path for testing a device under test.

2. The probe of claim 1 further comprising another conductive member positioned above said elongate conductor, wherein said elongate conductor and said conductive member is less than 10 times the distance between said elongate conductor and said another conductive member.

3. The probe of claim 1 further comprising another conductive member positioned above said elongate conductor, wherein said elongate conductor and said conductive member is less than 7 times the distance between said elongate conductor and said another conductive member.

4. The probe of claim 1 further comprising another conductive member positioned above said elongate conductor, wherein said elongate conductor and said conductive member is less than 5 times the distance between said elongate conductor and said another conductive member.

5. The probe of claim 1 further comprising another conductive member positioned above said elongate conductor, wherein said elongate conductor and said conductive member is less than 4 times the distance between said elongate conductor and said another conductive member.

6. The probe of claim 1 further comprising another conductive member positioned above said elongate conductor, wherein said elongate conductor and said conductive member is less than 2 times the distance between said elongate conductor and said another conductive member.

7. A probe comprising:
   (a) a dielectric substrate supporting an elongate conductor on a first side of said substrate and a conductive member supported by said second side of said substrate wherein said conductive member and said elongate conductor forming a controlled impedance structure;
   (b) a conductive path between said first side of said substrate and said second side of said substrate in a region within the periphery of said substrate for at least a majority of the thickness of said substrate; and
   (c) a contact electrically interconnected to said conductive path for testing a device under test.

8. The probe of claim 7 further comprising another conductive member positioned above said elongate conductor, wherein said elongate conductor and said conductive member is less than 10 times the distance between said elongate conductor and said another conductive member.

9. The probe of claim 7 further comprising another conductive member positioned above said elongate conductor, wherein said elongate conductor and said conductive member is less than 7 times the distance between said elongate conductor and said another conductive member.

10. The probe of claim 7 further comprising another conductive member positioned above said elongate conductor, wherein said elongate conductor and said conductive member is less than 5 times the distance between said elongate conductor and said another conductive member.

11. The probe of claim 7 further comprising another conductive member positioned above said elongate conductor, wherein said elongate conductor and said conductive member is less than 4 times the distance between said elongate conductor and said another conductive member.

12. The probe of claim 7 further comprising another conductive member positioned above said elongate conductor, wherein said elongate conductor and said conductive member is less than 2 times the distance between said elongate conductor and said another conductive member.

* * * * *